United States Patent
Vilas Boas et al.

(10) Patent No.: US 9,356,569 B2
(45) Date of Patent: May 31, 2016

(54) READY-FLAG CIRCUITRY FOR DIFFERENTIAL AMPLIFIERS

(71) Applicant: Freescale Semiconductor, Inc., Austin, TX (US)

(72) Inventors: Andre Luis Vilas Boas, Campinas (BR); Edevaldo Pereira Silva, Jr., Campinas (BR); Pedro Barbosa Zanetta, Campinas (BR); Eduardo Ribeiro da Silva, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/057,886

(22) Filed: Oct. 18, 2013

(65) Prior Publication Data

US 2015/0109054 A1 Apr. 23, 2015

(51) Int. Cl.
*H03K 5/153* (2006.01)
*H03F 3/45* (2006.01)
*H03F 1/30* (2006.01)
*G05F 3/30* (2006.01)

(52) U.S. Cl.
CPC .......... *H03F 3/45192* (2013.01); *H03F 1/301* (2013.01); *G05F 3/30* (2013.01); *H03F 2200/447* (2013.01); *H03F 2203/45538* (2013.01)

(58) Field of Classification Search
CPC ....... H05K 5/082; H05K 5/13; H03F 3/45071
USPC ............................................................. 327/72
See application file for complete search history.

(56) References Cited

U.S. PATENT DOCUMENTS

| | | | |
|---|---|---|---|
| 5,013,934 A | 5/1991 | Hobrecht et al. | |
| 5,512,817 A * | 4/1996 | Nagaraj | G05F 3/267 323/316 |
| 5,852,376 A | 12/1998 | Kraus | |
| 6,222,399 B1 | 4/2001 | Imbornone et al. | |
| 7,190,212 B2 | 3/2007 | Shor et al. | |
| 7,768,343 B1 | 8/2010 | Sinitsky | |
| 7,919,999 B2 | 4/2011 | Narayanan et al. | |
| 2012/0126855 A1* | 5/2012 | Daigle | H03K 3/3565 327/66 |

* cited by examiner

*Primary Examiner* — Sibin Chen
*Assistant Examiner* — Metasebia Retebo

(57) ABSTRACT

Ready-flag circuitry for differential amplifiers. In some embodiments, a semiconductor device may include an amplifier including two inputs, and a ready-flag circuit operably coupled to the amplifier, the ready-flag circuit configured to monitor two or more internal nodes of the amplifier and to produce a signal indicating whether a voltage or current difference between the two inputs has been minimized. In other embodiments, a method may include monitoring, via a ready-flag circuit, a first and a second internal node of a differential amplifier, wherein the differential amplifier is part of a bandgap voltage reference circuit and producing, via the ready-flag circuit, a signal indicating whether an output of the bandgap voltage reference circuit has reached a nominal value.

7 Claims, 4 Drawing Sheets

CURVE 301 - VDD
CURVE 302 - NODE 121
CURVE 303 - NODE 122
CURVE 304 - NODE 204 (READY-FLAG)
CURVE 305 - VN
CURVE 306 - VP

US 9,356,569 B2

READY-FLAG CIRCUITRY FOR DIFFERENTIAL AMPLIFIERS

FIELD

This disclosure relates generally to semiconductors, and more specifically, to ready-flag circuitry for differential amplifiers.

BACKGROUND

It is often desirable to know when an analog circuit is ready for operation. Many analog circuits receive their operating voltages through differential amplifiers. For example, a System-on-Chip (SOC)'s voltage monitor (VM) circuit may operate with a voltage received from a bandgap reference, which in turn is built using a differential amplifier. As the inventors hereof have recognized, such a bandgap reference should be capable of guaranteeing the VM circuit's safe state until the reference voltage is close to its nominal value. Accordingly, to address these and other concerns, the inventors hereof have developed ready-flag circuitry for differential amplifiers.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Disclosed herein is ready-flag circuitry for differential amplifiers. In some embodiments, such a ready-flag circuit may provide robust, reliable, general-use, and process, voltage, and temperature (PVT)-independent operation. Moreover, a ready-flag circuit may be used with a bandgap reference circuit to identify the moment at which the bandgap reference voltage has attained or is otherwise close to its nominal value. This is contrast with other techniques that only indicate a bandgap reference has successfully started up, and which may be based on supply voltage monitoring and/or time delay. In various implementations discussed herein, a ready-flag circuit may monitor or otherwise take into account one or more internal nodes of a bandgap reference circuit and/or differential amplifier.

Figure 1:
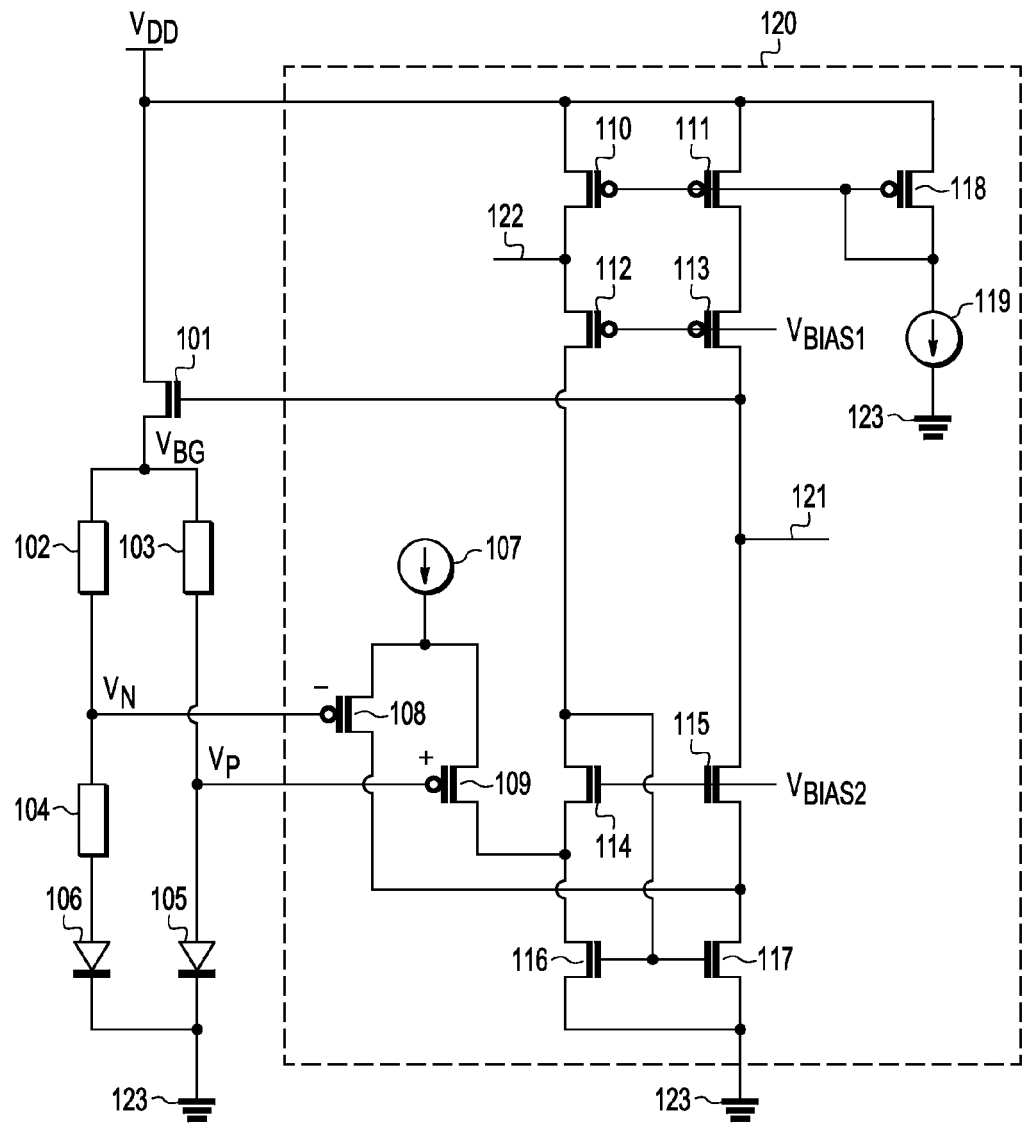
FIG. 1 is a circuit diagram of an example of a folded cascade differential amplifier used in a bandgap reference according to some embodiments.

FIG. 1 is a circuit diagram of an example of a folded cascade differential amplifier used in a bandgap reference and monitored by ready-flag circuitry, according to some embodiments. Particularly, bandgap reference circuit 100 includes N-type Metal-Oxide Semiconductor (NMOS) transistor 101 having its drain terminal (more generally referred to as a current terminal or electrode) coupled to supply voltage $V_{dd}$, and its source terminal (also more generally referred to as a current terminal or electrode) coupled to resistors 102 and 103. Resistor 102 is coupled to resistor 104, and resistors 103 and 104 are coupled to the anodes of diodes 105 and 106, respectively. The cathodes of diodes 105 and 106 are coupled to reference node 123 (e.g., ground). In some embodiments, one or more of elements 101-106 may be collectively referred to as a "bandgap core."

In some implementations, diode 105 may be replaced by a first PNP Bipolar Junction Transistor (BJT), the first BJT having its emitter terminal coupled to resistor 103 and its base and collector terminals coupled to reference node 123. Similarly, diode 106 may be replaced by a second PNP BJT having its emitter terminal coupled to resistor 104 and its base and collector terminals coupled to reference node 123.

Bandgap reference circuit 100 further includes folded cascode differential amplifier 120 having node 121 (referred to as a first internal node of amplifier 120). Meanwhile, a bandgap voltage ($V_{bg}$) at the node between NMOS transistor 101 and resistors 102 and 103 may be used as a PVT-independent voltage source by certain analog blocks within a System-on-Chip (SOC) or the like.

Specifically, the node between resistors 102 and 104 is coupled to the gate terminal (more generally referred to as a control terminal or electrode) of P-type MOS (PMOS) transistor 108, which serves as an inverting node of an operational amplifier. Meanwhile, the node between resistor 103 and diode (or BJT) 105 is coupled to the gate of PMOS transistor 109, which serves and a non-inverting node of the operational amplifier. The source terminals of PMOS transistors 108 and 109 are coupled to current source 107.

The drain of PMOS transistor 108 is coupled to a node between the source of NMOS transistor 114 and the drain of NMOS transistor 116, whereas the drain of PMOS transistor 109 is coupled between the source of NMOS transistor 115 and the drain of NMOS transistor 117. The sources of NMOS transistors 116 and 117 are coupled to reference node 123. The gates of NMOS transistors 116 and 117 are coupled together, as are the gates of NMOS transistors 114 and 115. Also, the gates of NMOS transistors 116 and 117 are coupled to the drain terminal of NMOS transistor 114.

The drain of NMOS transistor 114 is coupled to the drain of PMOS transistor 112, and the drain of NMOS transistor 115 is coupled to the drain of PMOS transistor 113. The gate of NMOS transistor 101 is coupled to the drain of PMOS transistor 113, which is also coupled to node 121.

The source of PMOS transistor 112 is coupled to the drain of PMOS transistor 110, and the source of PMOS transistor 113 is coupled to the drain of PMOS transistor 111. The node between the source of PMOS transistor 112 and the drain of PMOS transistor 110 is designated as node 122 (referred to as a second internal node of differential amplifier 120), and is examined in more detail below. The sources of PMOS transistors 110, 111, and 118 are coupled to supply voltage $V_{dd}$. As such, the voltage at node 122 tracks the difference between supply voltage $V_{dd}$ and the drain-to-source voltage ($V_{ds}$) of PMOS transistor 110

The gates of PMOS transistors 112 and 113 are coupled together, and the gates of PMOS transistors 110 and 111 are also coupled together. The drain of PMOS transistor 118 is coupled to its gate and to current source 119, which in turn is coupled to reference node 123. Moreover, the gate of PMOS transistor 113 is biased with a first bias voltage $V_{BIAS1}$, and the gate of NMOS transistor 115 is biased with a second bias voltage $V_{BIAS2}$.

In this example, differential amplifier 120 is said to have attained "operational status" when its control loop is closed, thereby minimizing the voltage difference between the inputs of the amplifier. Usually, this voltage difference may be no more than a few millivolts. Conversely, in the case of current mode amplifiers, an amplifier is said to have attained "operational status" when the difference between its input currents is very small (e.g., of the order of tens of ηA up to a few μA). In various implementations, whether a differential or current mode amplifier achieves operational status indicates the readiness of a semiconductor device (or portion thereof) to perform a given operation.

In FIG. 1, the control loop includes elements 107-117, which control PMOS transistor 101 so that the differential amplifier's inverting and non-inverting inputs have the smallest voltage difference possible. When this happens, the node between components 101, 102, and 103 provides bandgap voltage $V_{bg}$.

Still referring to FIG. 1, bandgap voltage reference 100 may be used as a PVT-independent voltage reference circuit in numerous types of Integrated Circuits (IC). Particularly, reference 100 produces a fixed (constant) voltage irrespective of power supply variations, temperature changes, and loading. In some cases, $V_{bg}$ may be approximately 1.25 V, near to the theoretical 1.22 eV bandgap of silicon at 0 K.

Figure 2:
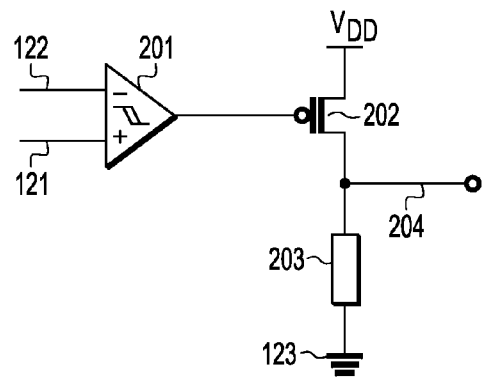
FIG. 2 is a circuit diagram of an example of ready-flag circuitry, according to some embodiments.

FIG. 2 is a circuit diagram of an example of ready-flag circuitry 200. In some embodiments, ready-flag circuitry 200 may be coupled to internal nodes of differential amplifier 120 of FIG. 1 to produce a signal indicating whether the differential amplifier has attained operational status, and therefore whether node 121 of bandgap voltage reference circuit 100 has reached a nominal value.

To that end, ready-flag circuit 200 includes voltage or current comparator 201 having a non-inverting input coupled to first internal node 121 and an inverting input coupled to second internal node 122. For example, comparator 201 may include a Schmitt trigger-type buffer or the like. The output of comparator 201 is coupled to the gate of PMOS transistor 202. The source of PMOS transistor 202 is coupled to supply voltage $V_{dd}$, and the drain of PMOS transistor 202 is coupled to reference node 123 through resistor 203. The output of ready-flag circuit 200 is a ready-flag signal provided at node 204 between the drain of PMOS transistor 202 and resistor 203.

In operation, the pull-down circuit (PMOS transistor 202 and resistor 203) coupled to the output of comparator 201 is configured to couple the ready-flag signal at node 204 to a reference voltage value of node 123 when differential amplifier 120 has not yet attained operational status.

First internal node 121 attains an approximately constant voltage value when the differential amplifier reaches a predetermined bias condition. Particularly, node 121 ramps with $V_{dd}$ (less voltage drop) until $V_{dd}$ reaches a predetermined voltage level. From this point, the voltage on node 121 is equal to $V_{dd}$ plus the gate-to-source voltage of transistor 101, which has only a small variation with $V_{dd}$. Node 122 also tends to ramp with $V_{dd}$. When $V_{dd}$ reaches a predetermined voltage level, the voltage drop between node 122 and $V_{dd}$ increases. If $V_{dd}$ is increased further, the voltage at node 122 will be higher than the voltage at node 121, after which the ready-flag is released.

In other words, a voltage value of second internal node 122 follows supply voltage value $V_{dd}$ of differential amplifier 120. As such, the voltage value of second internal node 122 is lower than the voltage value of the first internal node 121 when differential amplifier 120 has not reached the predetermined bias condition. Conversely, the voltage value of second internal node 122 becomes larger than the voltage value of first internal node 121 when differential amplifier 120 has reached the predetermined bias condition.

As such, when the voltage at second internal node 122 becomes greater than the voltage at first internal node 121, the output of comparator 201, when applied to the gate of PMOS transistor 202, causes a ready-flag signal at 204 to indicate that the bandgap voltage has reached a nominal value and that differential amplifier 120 has attained operational status.

Figure 3:
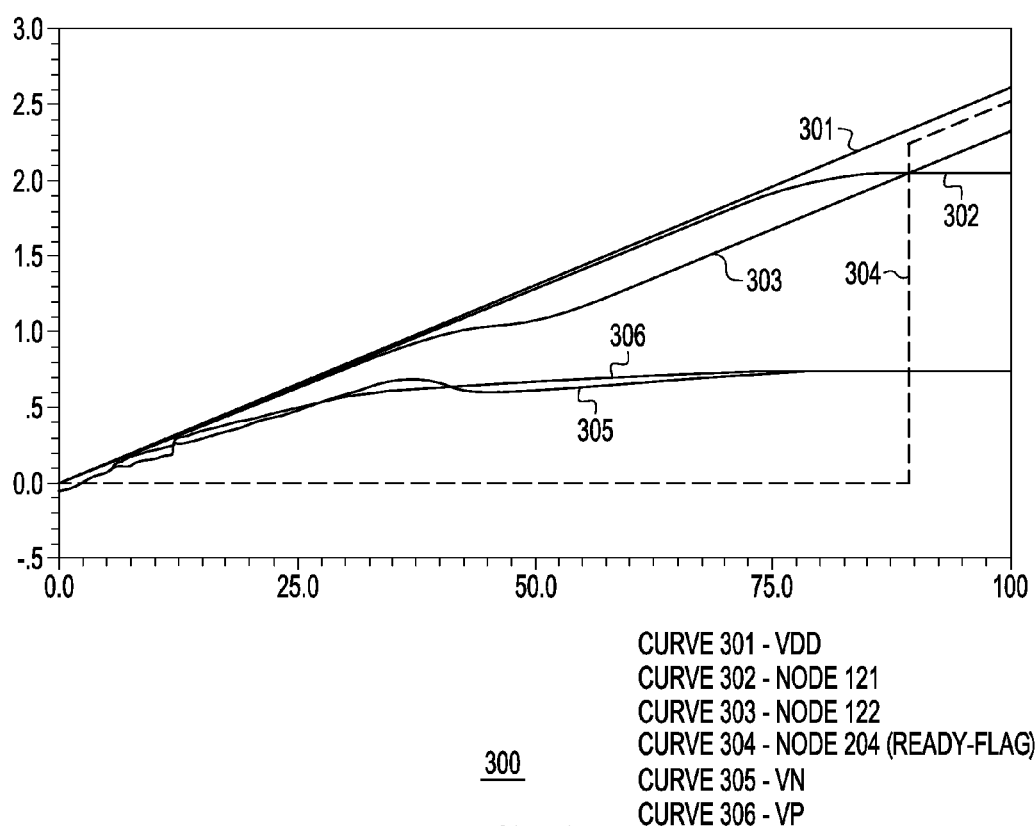
FIG. 3 is a graph illustrating operation of an example of ready-flag circuitry, according to some embodiments.

To illustrate the foregoing, graph 300 of FIG. 3 shows operation of ready-flag circuitry 200, according to some embodiments. Particularly, curve 301 shows the value of $V_{dd}$ supplied to operational amplifier 120 as it increases linearly during a startup time. Curve 302 shows how the value of bandgap voltage at first internal node 121, and curve 303 shows how the voltage value of second internal node 122 as those values vary over time. Meanwhile, curve 304 shows the value of ready-flag signal at node 204.

Graph 300 has been divided into three distinct regions—namely regions 1, 2, and 3 (shown in the time axis). In region 1, curve 302 is above curve 303 because there is not enough supply voltage $V_{dd}$ to bias the circuit. Hence, the ready-flag signal at node 204 is grounded by pull-down resistor 203. In region 2, differential amplifier 120 starts to work. The voltage at the gate of PMOS transistor 108 (inverting input) is lower than the voltage at the gate of PMOS transistor 109 (non-inverting input), and the voltage at first internal node 121 shown as curve 302 increases to also increase the current into the bandgap core (that is, elements 101-105). Also, PMOS transistor 113 is in triode mode.

In region 3, the voltage at second internal node 122, shown by curve 303, is greater than the voltage at first internal node 121, shown by curve 302. That is because the voltage at first internal node 121 is kept constant while the voltage at second internal node 122 continues to track the difference between $V_{dd}$ and the $V_{ds}$ of PMOS transistor 110.

It may be noted from graph 300 that although the bandgap voltage at first internal node 121 (curve 302) assumes its nominal value at a point prior to t=2. Nonetheless, the ready-flag signal at node 204 only changes its value (from 0 V or the value of reference node 123) when the voltage at second internal node 122 becomes larger than the voltage at first internal node 121—that is, when curve 303 crosses curve 302.

In short, ready-flag circuitry 200 may be used to generate a PVT-robust and reliable flag to signalize when a differential amplifier has attained operational status (e.g., a predetermined of selectable bias point and gain). The flag generation may rely, at least in part, on one or more internal nodes of the differential amplifier in order to check its operational status. Further, because the internal nodes truly report what is happening to the differential amplifier, they may be used in applications such as bandgap references to indicate when the reference reached the nominal value.

Figure 4:
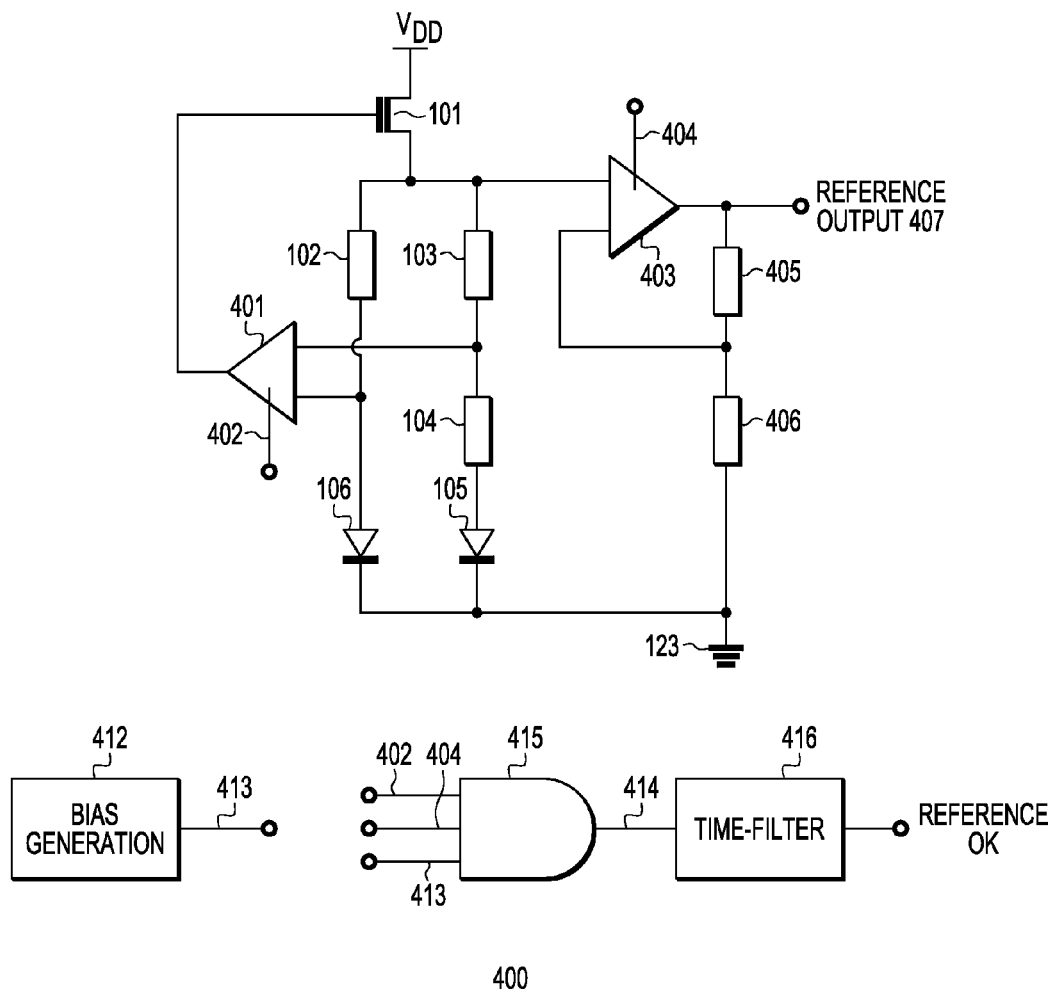
FIG. 4 is a circuit diagram of a buffered voltage reference circuit, according to some embodiments.

FIG. 4 is a circuit diagram of a buffered voltage reference circuit according to some embodiments. In this example, a bandgap reference circuit or core includes elements 101-106, similar as in FIG. 1. First differential amplifier 401 is coupled to the bandgap reference circuit, the first differential amplifier is coupled to a first node and to a second node of the bandgap core. Accordingly, a first ready-flag circuit (not shown) is coupled to or otherwise included within first differential amplifier 401. The first ready-flag circuit is configured to monitor a first and a second internal nodes of first differential amplifier 401, as shown in FIGS. 1 and 2; and to produce first signal 402 indicating whether first differential amplifier 401 has achieved its bias point and its inputs are close to their final respective states.

Second differential amplifier 403 is coupled to a voltage supply node (the source of NMOS transistor 101) and to an output node of the second differential amplifier located between resistors 405 and 406, where the bandgap reference voltage output is provided at node 407. As such, a second ready-flag circuit (not shown) is coupled to or otherwise included in second differential amplifier 403. The second ready-flag circuit is configured to monitor a first and a second nodes of second differential amplifier 403, as shown in FIGS. 1 and 2; and to produce second signal 404 indicating whether second differential amplifier 403 has attained operational status.

Logic circuit or AND gate 415 receives signals 402-404 and its output is coupled to time-filter (e.g., a de-glitcher) 416, which in turn outputs "reference ok" signal 414 after the circuit has attained operational status for a pre-determined period of time. Signal 414 is at a logic high when each of 402-404 is also at a high voltage value, indicating that the first and second differential amplifiers have attained operational status (signals 402 and 403, respectively) and that bias generation circuit 412, which provides biasing to various elements within circuit 400, is ready (signal 413). In other embodiments, a NAND may be used instead of AND gate 415, and its output may be coupled to an inverter constructed with PMOS transistor and a pull-down resistor as in FIG. 2. Alternatively, circuit 400 may deliver a negated ready signal (goes to low when ready).

As described herein, in an illustrative, non-limiting embodiment, a semiconductor device may include an amplifier including two inputs, and a ready-flag circuit operably coupled to the amplifier, the ready-flag circuit configured to monitor two or more internal nodes of the amplifier and to produce a signal indicating whether a voltage or current difference between the two inputs has been minimized. For example, the differential amplifier may be part of a bandgap voltage reference circuit. Also, the ready-flag circuit may be coupled to a time-filter circuit, the time-filter circuit configured to output the signal after the amplifier has attained operational status for a pre-determined period of time.

In some implementations, producing the signal may include signaling whether an output of the bandgap voltage reference circuit has reached a nominal value. For instance, the amplifier may be a folded cascode differential amplifier. A first internal node may be asserted high and it may attain an approximately constant voltage value when the amplifier reaches a predetermined bias condition. Additionally or alternatively, a voltage value of a second internal node may follow a supply voltage value of the amplifier, and the voltage value of the second internal node may be lower than a voltage value of the first internal node when the amplifier has not reached the predetermined bias condition.

The voltage value of the second internal node may become larger than the voltage value of the first internal node when the amplifier has reached the predetermined bias condition. Also, the ready-flag circuit may include a voltage or current comparator having an inverting input coupled to the first internal node and a non-inverting input coupled to the second internal node. Moreover, the voltage or current comparator may include a Schmitt trigger-type buffer. In some cases, the ready-flag circuit may further include a pull-down circuit coupled to an output of the voltage or current comparator, the pull-down circuit configured to couple the signal to a reference voltage value when the amplifier has not attained operational status.

In another illustrative, non-limiting embodiment, a method may include monitoring, via a ready-flag circuit, a first and a second internal node of a differential amplifier, where the differential amplifier is part of a bandgap voltage reference circuit and producing, via the ready-flag circuit, a signal indicating whether an output of the bandgap voltage reference circuit has reached a nominal value.

In some implementations the first internal node may be asserted high and may attain an approximately constant voltage value in response to the differential amplifier having reached a bias condition. A voltage value of the second internal node may follow a supply voltage value of the differential amplifier, and the voltage value of the second internal node may be lower than a voltage value of the first internal node in response to the differential amplifier not having reached the bias condition. Also, the voltage value of the second internal node may become larger than the voltage value of the first internal node in response to the differential amplifier having reached the predetermined bias condition.

The method may further include combining the signal with another signal produced by another ready-flag circuit, the other ready-flag circuit coupled to a first and a second internal node of another differential amplifier, the other signal configured to indicate whether the other differential amplifier has attained operational status, and the combination of the signal and the other signal configured to indicate whether a semiconductor circuit including the operational amplifier and the other operational amplifier is ready to perform a given operation.

In yet another illustrative, non-limiting embodiment, an integrated circuit may include a bandgap reference circuit; a first differential amplifier coupled to the bandgap reference circuit, the first differential amplifier coupled to a first and second internal nodes of the bandgap reference circuit; a first ready-flag circuit operably coupled to the first differential amplifier, the first ready-flag circuit configured to monitor a first and a second nodes of the first differential amplifier and to produce a first signal indicating whether the first differential amplifier has attained operational status; a second differential amplifier coupled to the bandgap reference circuit, the second differential amplifier coupled to a voltage supply node of the bandgap reference circuit and to an output of the second differential amplifier; a second ready-flag circuit operably coupled to the second differential amplifier, the second ready-flag circuit configured to monitor a first and a second nodes of the second differential amplifier and to produce a second signal indicating whether the second differential amplifier has attained operational status; and a logic circuit configured to receive the first and second signals and to output a third signal indicating whether the first and second differential amplifiers have attained operational status.

In some cases, producing the first signal may include signaling whether an output of the bandgap voltage reference circuit has reached a nominal value. The first or second differential amplifier may be a folded cascode differential amplifier. The first node of the first differential amplifier may be asserted high and it may attain an approximately constant voltage value when the first differential amplifier reaches a predetermined bias condition.

A voltage value of the second node of the first differential amplifier may follow a supply voltage value of the first differential amplifier, and the voltage value of the second node of the first differential amplifier may be lower than a voltage value of the first node of the first differential amplifier when the first differential amplifier has not reached the predetermined bias condition. The voltage value of the second node of the first differential amplifier may become larger than the voltage value of the first node of the first differential amplifier when the first differential amplifier has reached the predetermined bias condition.

In many implementations, the systems and methods disclosed herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Figure 5:
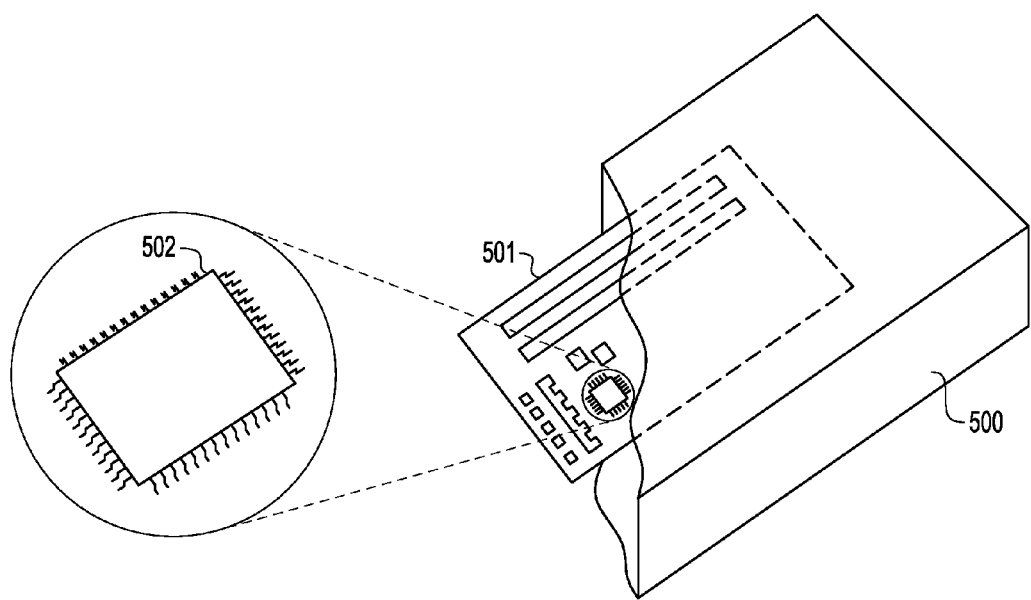
FIG. 5 is a diagram of an example of an electronic device having one or more electronic microelectronic device packages, according to some embodiments.

Turning to FIG. 5, a block diagram of electronic device 500 is depicted. In some embodiments, electronic device 500 may be any of the aforementioned electronic devices, or any other electronic device. As illustrated, electronic device 500 includes one or more Printed Circuit Boards (PCBs) 501, and at least one of PCBs 501 includes one or more microelectronic device packages(s) 502. In some implementations, device package(s) 502 may include ready-flag circuits for differential amplifiers, as discussed above.

Examples of device package(s) 502 may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), a Graphics Processing Unit (GPU), or the like. Additionally or alternatively, device package(s) 502 may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate RAM, an Erasable Programmable ROM (EPROM), an Electrically Erasable Programmable ROM (EEPROM), etc. Additionally or alternatively, device package(s) 502 may include one or more mixed-signal or analog circuits, such as, for example, Analog-to-Digital Converter (ADCs), Digital-to-Analog Converter (DACs), Phased Locked Loop (PLLs), oscillators, filters, amplifiers, etc. Additionally or alternatively, device package(s) 502 may include one or more Micro-ElectroMechanical Systems (MEMS), Nano-ElectroMechanical Systems (NEMS), or the like.

Generally speaking, device package(s) 502 may be configured to be mounted onto PCB 501 using any suitable packaging technology such as, for example, Ball Grid Array (BGA) packaging or the like. In some applications, PCB 501 may be mechanically mounted within or fastened onto electronic device 500. It should be noted that, in certain implementations, PCB 501 may take a variety of forms and/or may include a plurality of other elements or components in addition to device package(s) 502. It should also be noted that, in some embodiments, PCB 501 may not be used and/or device package(s) 502 may assume any other suitable form(s).

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A semiconductor device, comprising: a differential amplifier including two inputs, wherein the differential amplifier is part of a bandgap voltage reference circuit; and a ready-flag circuit operably coupled to the differential amplifier, the ready-flag circuit configured to monitor two or more internal nodes of the differential amplifier and to produce a signal indicating whether a voltage difference between the two inputs has been minimized, wherein a first of the two internal nodes is located between two PMOS transistors within the differential amplifier, wherein a second of the two internal nodes is located between a PMOS transistor and an NMOS transistor within the differential amplifier, wherein the ready-flag circuit is configured to produce the signal after the differential amplifier has attained operational status and the output of the bandgap voltage reference circuit has reached its nominal value for a pre-determined period of time, wherein the first internal node is asserted high and attains an approximately constant voltage value when the differential amplifier reaches a predetermined bias condition, wherein a voltage value of the second internal node follows a supply voltage value of the differential amplifier, and wherein the voltage value of the second internal node is lower than a voltage value of the first internal node when the differential amplifier has not reached the predetermined bias condition.

2. The semiconductor device of claim 1, wherein the differential amplifier is a folded cascode differential amplifier.

3. The semiconductor device of claim 1, wherein the voltage value of the second internal node becomes larger than the voltage value of the first internal node when the differential amplifier has reached the predetermined bias condition.

4. The semiconductor device of claim 1, wherein the ready-flag circuit includes a voltage or current comparator having an inverting input coupled to the first internal node and a non-inverting input coupled to the second internal node, and wherein the voltage or current comparator includes a Schmitt trigger-type buffer.

5. The semiconductor device of claim 4, wherein the ready-flag circuit further includes a pull-down circuit coupled to an output of the voltage or current comparator, the pull-down circuit configured to couple the signal to a reference voltage value when the differential amplifier has not attained operational status.

6. A method, comprising: monitoring, via a ready-flag circuit, a first and a second internal node of a differential amplifier, wherein the differential amplifier is part of a bandgap voltage reference circuit; and producing, via the ready-flag circuit, a signal indicating whether a voltage difference between the first and second internal nodes has been minimized, wherein a first of the two internal nodes is located between two PMOS transistors of the differential amplifier, wherein a second of the two internal nodes is located between a PMOS transistor and an NMOS transistor of the differential amplifier, wherein the ready-flag circuit is configured to produce the signal in response to the differential amplifier having reached a bias condition and an output of the bandgap voltage reference circuit having reached its nominal value for a predetermined period of time, wherein the first internal node is asserted high and attains an approximately constant voltage in response to the differential amplifier having reached the bias condition, wherein a voltage of the second internal node follows a supply voltage of the differential amplifier, and wherein the voltage of the second internal node is lower than a voltage of the first internal node in response to the differential amplifier not having reached the bias condition.

7. The method of claim 6, wherein the voltage of the second internal node becomes larger than the voltage of the first internal node in response to the differential amplifier having reached the bias condition.

\* \* \* \* \*